United States Patent [19]

May, Jr.

[11] 4,034,302
[45] July 5, 1977

[54] SMOOTH SEQUENCE GENERATOR FOR FRACTIONAL DIVISION PURPOSES

[75] Inventor: Carl Jerome May, Jr., Holmdel, N.J.

[73] Assignee: Bell Telephone Laboratories, Incorporated, Murray Hill, N.J.

[22] Filed: May 26, 1976

[21] Appl. No.: 690,100

[52] U.S. Cl. .............................. 328/39; 307/225 R; 328/46

[51] Int. Cl.² ................. H03K 21/00; H03K 23/06

[58] Field of Search ................. 307/225 R, 220 R; 328/39, 38, 46; 331/51, 50

[56] References Cited

UNITED STATES PATENTS

| | | | |
|---|---|---|---|
| 2,824,228 | 2/1958 | Carmichael | 328/39 |
| 3,353,104 | 11/1967 | Loposer | 328/39 |
| 3,446,947 | 5/1969 | Overstreet, Jr. | 328/39 |
| 3,543,295 | 11/1970 | Overstreet, Jr. | 328/39 |
| 3,896,387 | 7/1975 | Kokado | 328/39 |
| 3,976,946 | 8/1976 | Schroder | 328/39 |

Primary Examiner—Stanley D. Miller, Jr.
Attorney, Agent, or Firm—John K. Mullarney

[57] ABSTRACT

A reference source of uniformly spaced pulses is coupled to the input of a smooth sequence generator (SSG) which is capable of dividing the reference pulse sequence by any proper, predetermined, rational fraction (e.g., 193/512). The SSG comprises a plurality of routing circuits connected in tandem. Each routing circuit has a first and second output and a control terminal which serves to route a pulse presented at the routing circuit input to either said first or second output. The first output of each routing circuit is connected to the next tandem-connected routing circuit. A feedback connection from the first output of each routing circuit to the control terminal of the preceding routing circuit serves to control the routing of a pulse presented to the input of the latter. A synchronization circuit is coupled to the output of said reference source, via a divider circuit, and to the first output of the last tandem-connected routing circuit. The sync circuit output is delivered to the control terminal of said last routing circuit to constrain (i.e., lock) the frequency, and preferably even the phase, of the SSG source.

6 Claims, 9 Drawing Figures

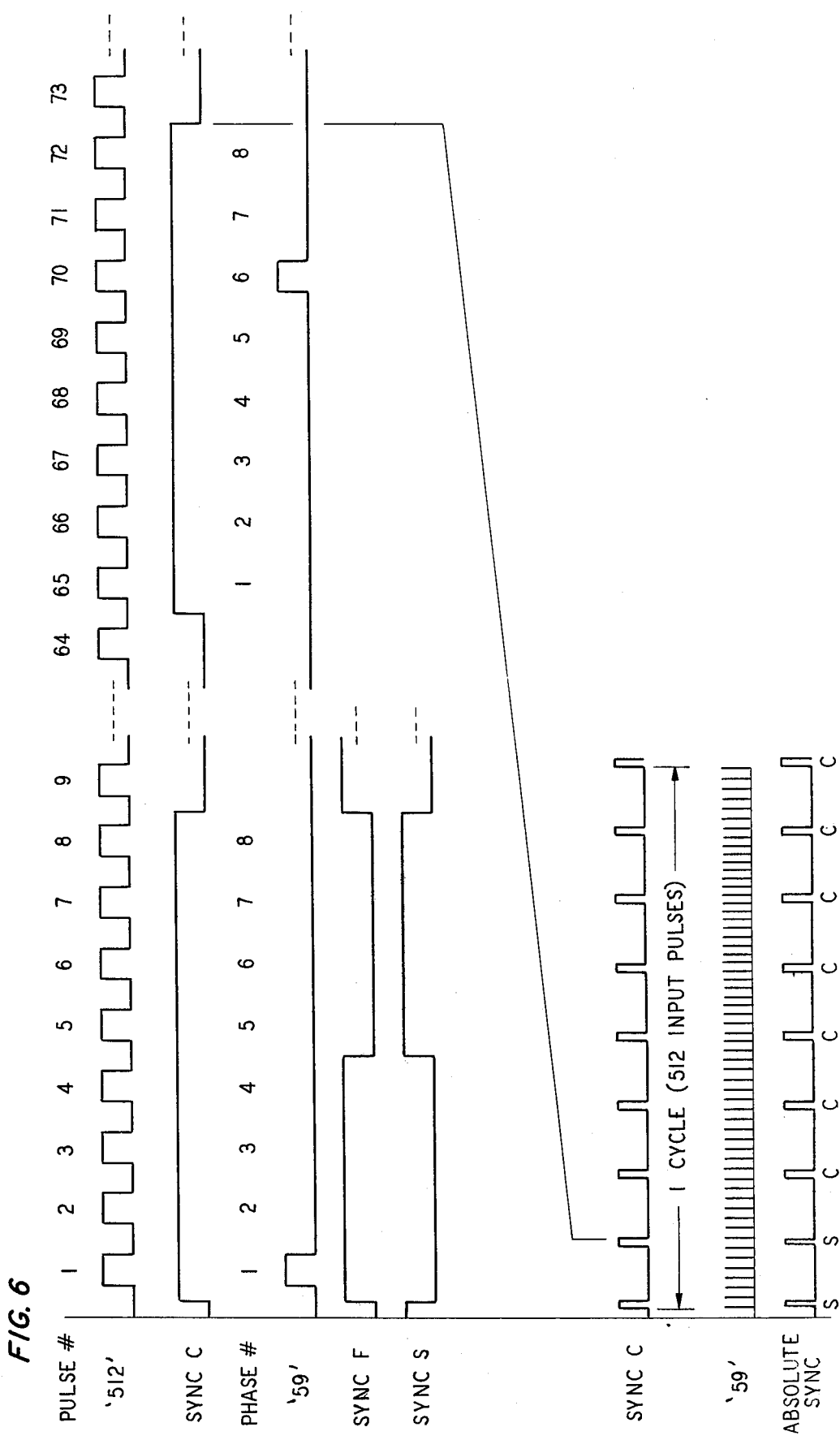

SMOOTH SEQUENCE GENERATOR FOR FRACTIONAL DIVISION PURPOSES

BACKGROUND OF THE INVENTION

The present invention relates to a smooth sequence generator that is capable of dividing a uniform pulse sequence by virtually any proper, predetermined, rational fraction.

Apparatus has been proposed heretofore for dividing a uniform pulse sequence by an arbitrarily variable value — see, for example, the patent to E. T. Colton, U.S. Pat. No. 3,297,953, issued Jan. 10, 1967. The cited patent is typical of the genre and includes a rate multiplier, a voltage controlled oscillator VCO (in addition to the reference source oscillator) and a phase-locked loop in which the VCO is coupled. Besides the complexity of this prior art divider circuitry, it has been found to be limited in the division ratio that can be achieved. Again by way of example, the circuit of the cited Colton patent provides an output frequency (i.e., output pulse rate) which is quite restricted in its (division) range vis-a-vis the reference frequency or reference pulse sequence (see the Colton patent, column 2, lines 21–26).

It is accordingly a primary object of the present invention to provide apparatus that is capable of dividing a uniform pulse sequence by virtually any predetermined, proper rational fraction.

The necessity increasingly arises in digital systems to generate an external pulse rate whose frequency is related to a reference clock frequency by some (unusual) proper rational fraction while still maintaining synchronism with the reference clock source. In many such cases, it is a requirement that pulses of the generated frequency be as uniformly spaced as possible within the constraint of synchronism. Such pulse sequences are called "smooth" in contrast with uniform pulse sequences in which each pulse is separated from its predecessor by a fixed interval. The smooth sequences possess a number of interesting properties in their structure; these properties are treated in the article "Smooth Pulse Sequences" by A. J. Lincoln et al., *Proceedings of the Third Annual Princeton Conference on Information Sciences and Systems*, 1969, pp. 350–354.

A technique commonly used for forming these synchronous frequency multiples uses the "rate multipler" and involves detecting the zero-to-one transitions of the stages of a binary counter chain. The rate multiplier technique, although often capable of forming relatively smooth sequences, does not form a true smooth sequence, as has been noted in the above-cited article by A. J. Lincoln et al.

It is a further object of the invention to achieve a smooth pulse sequence with a minimal of timing uncertainty.

A still further object of the invention is to provide a circuit which implements the smooth pulse sequence function in an expeditious and economical manner.

SUMMARY OF THE INVENTION

A smooth sequence generator (SSG) in accordance with the present invention comprises a plurality of routing circuits coupled in tandem. The SSG is capable of dividing a uniform pulse sequence, delivered to the input thereof, by any predetermined rational fraction. Each routing circuit has a first and second output and a control terminal which is used to route a pulse presented at the routing circuit input to either said first or second output. The first output of each routing circuit is connected to the next tandem-coupled routing circuit. A feedback connection from the first output of each routing circuit to the control terminal of the preceding routing circuit serves to control the routing of a pulse presented to the input of the latter. A synchronization circuit is coupled to the source of the uniform pulse sequence and to the first output of the last tandem-coupled routing circuit. The sync circuit provides an output signal which is coupled to the control terminal of said last routing circuit to constrain the frequency or phase of the SSG output to the uniform pulse sequence.

BRIEF DESCRIPTION OF THE DRAWINGS

The invention will be more fully appreciated from the following detailed description when the same is considered in connection with the accompanying drawings, in which:

FIG. 6 shows certain waveforms useful in the explanation of the invention; and

DETAILED DESCRIPTION

For purposes of description, let us assume that the smooth sequence generator (SSG) of the invention receives a uniform pulse sequence of 16.384 Mbs and produces a smooth pulse sequence of 6.176 Mbs. Note that the fraction $6.176 \times 10^6/16.384 \times 10^6$ can be reduced to the prime fraction 193/512. Therefore, the desired smooth pulse sequence will be periodic, producing 193 output pulses for each 512 input pulses. The numbers used for purposes of illustration are not entirely arbitrary or fortuitous, e.g., the numerator (193) of the prime fraction is the same as the number of bits per frame of the T1 Carrier (see "The T1 Carrier System" by D. F. Hoth, *Bell Laboratories Record*, November 1962, pages 358–363). However, as will be evident hereinafter, the principles of the present invention are of general applicability and a SSG can be designed in accordance with the invention to divide any given uniform pulse sequence by virtually any predetermined rational fraction.

Figure 1:
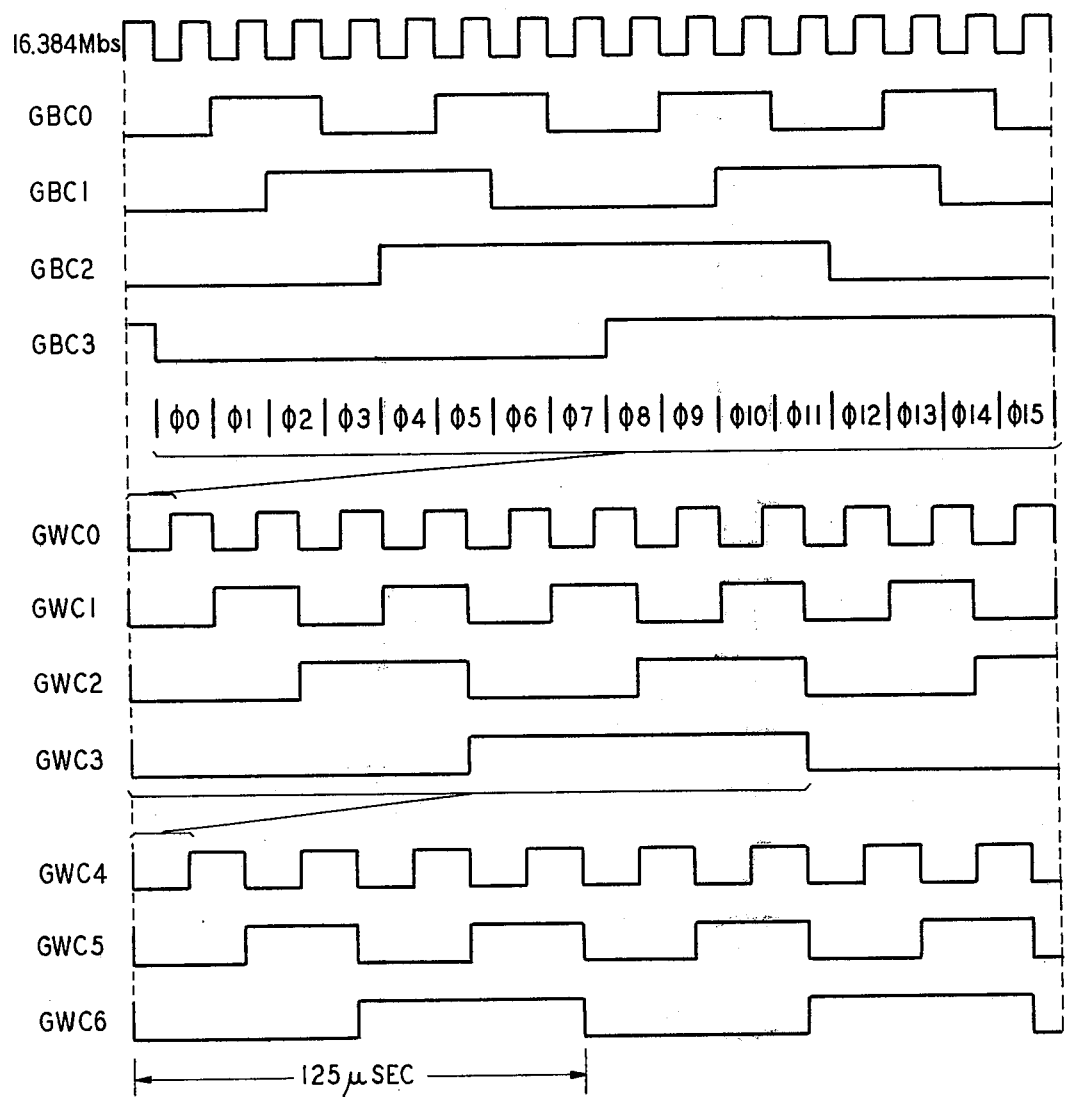
FIG. 1 shows a typical uniform pulse sequence and other waveforms which are readily derived therefrom.

The uniform pulse sequence of 16.384 Mbs is illustrated in FIG. 1 of the drawings. This signal is readily divided to produce four gray-coded signals designated GBS's (Generated Binary Code). These GBC's can be decoded to define 16 phases within a given channel time slot (i.e., one period of the GBC3 waveform), but this is of no consequence in the consideration of the present invention. The 16.384 Mbs signal is further divided to provide 7 binary signals designated GWC's (Generated Word Code). As will be evident to those in the art, these divider operations are very straightforward and hence will not be described in detail herein. As will be seen hereinafter, some, but not all, of the waveforms of FIG. 1 are utilized by the SSG of the invention; the others are used in other and different circuits of the systems that incorporates the SSG and thus can be disregarded for present purposes. For reasons of clarity and completeness, however, all of the GBC and GWC waveforms have been shown in FIG. 1.

Figure 2A:
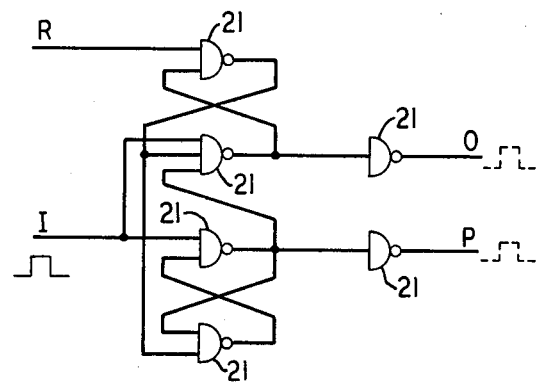
FIG. 2A shows a routing circuit, the building block from which the SSG of the invention is constructed.

Turning now to FIG. 2A of the drawings, the routing circuit shown therein comprises the building block from which the SSG is constructed. The routing circuit of FIG. 2A comprises the NAND gates 21 connected in the manner shown. This circuit has the property that a pulse presented at input I is reproduced at output O or output P depending only on the value of input R during the leading edge (i.e., the zero-to-one transition) of the pulse at input I. After this edge, any change of input R is ignored until the next leading edge of an input pulse at I. Thus, a slightly delayed version of the pulse at input I is routed to one of the two outputs, depending on the state of input R; each NAND gate causes a delay, which is typically measured in nanoseconds. This routing circuit will be recognized by those in the art as a version of the front end of the well-known, ubiquitous D flip-flop, manufactured and sold by Western Electric Company, Texas Instruments, Incorporated, and numerous others.

Figure 2B:
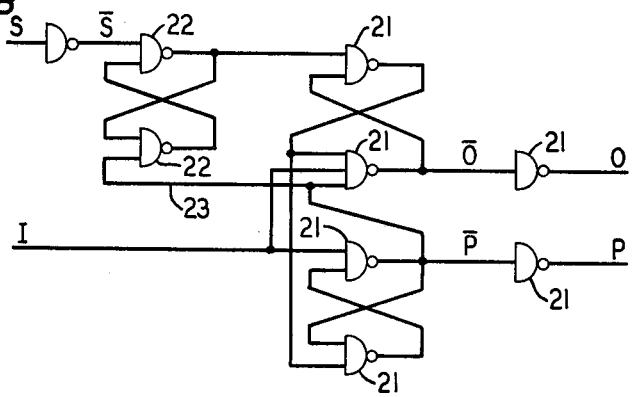
FIG. 2B shows the routing circuit of FIG. 2A modified in accordance with the purposes of the invention.

In FIG. 2B, the routing circuit of FIG. 2A is modified to include a single bit of storage such that a stream of pulses appearing at I is routed to output O until the storage element is "set" by a pulse at input S. The NAND gates 22 are interconnected in a known fashion to serve as a bistable storage circuit. With the storage element or circuit "set," the next input pulse at I is routed to output P and also "clears" the storage element because of the feedback connection 23. The storage element thus provides the input R information of FIG. 2A and a new input S is necessary to again set the storage element. It is this modified routing circuit that is utilized, in the manner to be described, to construct the SSG of the present invention.

Figure 2C:
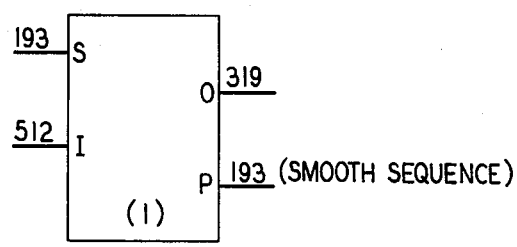
FIG. 2C is a block diagram of a typical routing circuit employed in the SSG.
Figure 3:
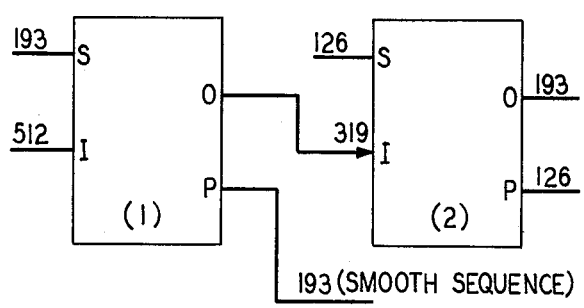
FIG. 3 is a block diagram of two routing circuits connected in tandem.

The routing circuit of FIG. 2B is shown in block form in FIG. 2C, this block representing the first block 1 of the SSG. Here the input at I is 16.384 Mbs or, in an interval of interest, 512 pulses. This first block will split the input (512) pulse train into two pulse trains as described above, one output having the desired smooth sequence of 193 pulses and the other the remaining 319 pulses. All we need to do to obtain the desired 193 smooth pulse sequence output is to propitiously set the storage element exactly 193 times. Assume for the moment that such a signal is available for the S input of this first block 1, then we can pursue the fate of the 319 pulses at output O. As shown in FIG. 3, these 319 pulses are used as the input to the second block 2 of the SSG.

Figure 4:
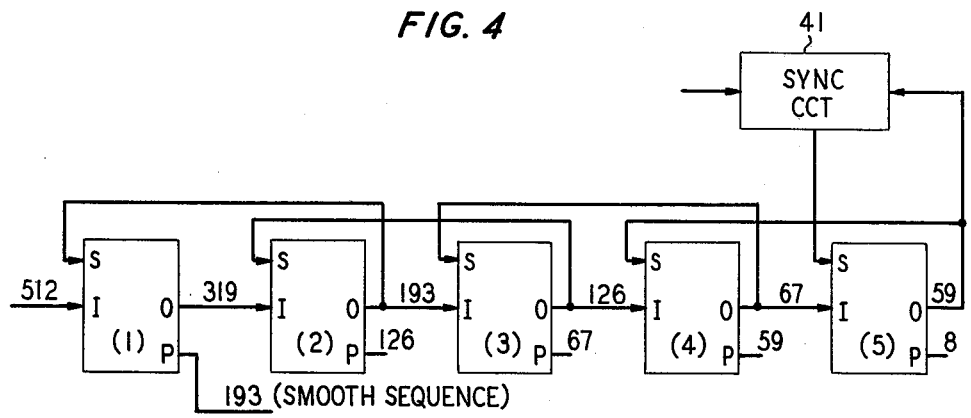
FIG. 4 is a simplified block diagram of a SSG constructed in accordance with the invention.

In particular, of these 319 pulses (when considered as part of the original 512 pulse train), 193 exactly precede the pulses of the desired smoot sequence output. The remaining 126 (of the 319) do not precede any of the pulses of the desired output. If we could set the storage element appropriately 126 times in the second block 2, its two outputs would have (at O) 193 pulses (which just precede those of the smooth sequence output) and at P, 126 pulses. Let us assume that this is indeed the case and further that the 193 pulse output is fed back to satisfy the requirement of the first block 1 and fed forward to be used as the input to the third block 3, as shown in FIG. 4. The 193 pulses that are fed back from block 2 to block 1 therefore serve as control pulses which control the routing of the 512 pulse train input presented to block 1.

Turning now to FIG. 4, the outputs of the third block 3 should provide that 126 control or set pulses needed by the second block and the remainder of 67 pulses. The 126 pulse output of block 3 is also fed forward to the fourth block 4 to be split into 67 pulses needed by the third block and a remainder of 59 pulses. A fifth block 5 then provides the 59 pulses for the fourth block and has a remainder of 8 pulses. The 8 set or routing control pulses for this last block will come from separate synchronization circuitry 41 to be described in detail hereinafter.

Figure 5:
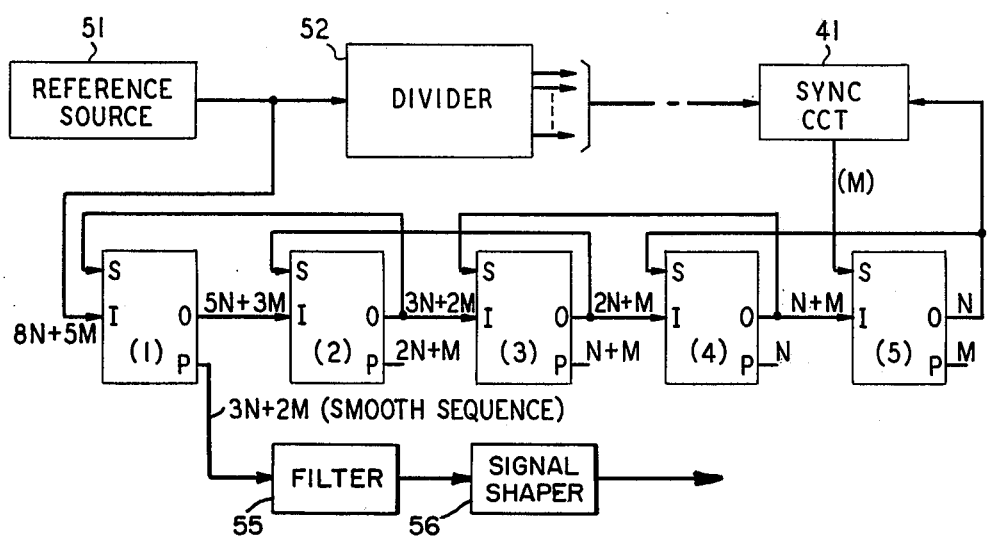
FIG. 5 is a further block diagram of the SSG of the invention.

Consider now FIG. 5 of the drawings. Here, again, the 5 blocks of the SSG are labeled 1 through 5. The outputs from block 5, which would be 59 and 8 pulses in the normal operation as just described, are labeled N and M, respectively. In accordance with the circuit operation previously described, we can write the number of pulses at all inputs and outputs of each block by proceeding in the reverse order from the preceding description. The inputs and outputs of each block are so labeled in FIG. 5 using the N and M designations. It will be observed that for each (8N + 5M) input pulses, the smooth sequence output from block 1 contains (3N + 2M) pulses. Since in a normal cycle N = 59 and M = 8 we have $$\frac{\text{Output}}{\text{Input}} = \frac{3N + 2M}{8N + 5M} = \frac{3 \times 59 + 2 \times 8}{8 \times 59 + 5 \times 8} = \frac{193}{512}.$$

Also, in the absence of a sync pulse (i.e., M = 0), for N = 1, there are
3N = 3 Output pulses, and
8N = 8 Input pulses.
This ratio, 3/8, is the first approximation to 193/512. As the circuit runs with this ratio, error accumulates between the output pulse position and the corresponding uniform pulse position until finally a correction is needed. A correction, with N still equal to one (N = 1) and M now equal to one (M = 1), produces
3N + 2M = 5 Output pulses for
8N + 5M = 13 Input pulses.

As suggested in FIG. 5, and as will be more evident hereinafter, the sync circuit 41 will select 8 of the N (= 59) pulses to correct the accumulated error.

As was the case for all blocks, a subset of 8 pulses of the 59 pulse output of the last block 5 exactly precedes the described 8 output pulses at 5 P. By identifying these 8 pulses with an external synchronizing signal, the desired set input is generated for the last block. Recognizing that the 59 output pulses are a subset of the original 512 input pulse train, consider for a moment the result if we make this external synchronizing signal simply a periodic pulse that "covers" 8 of each 64 of the original 512 pulse train, as shown by the first two waveforms of FIG. 6 labeled "512" and "Sync C", respectively, and name the input pulses covered by the sync signal as Phases 1 through 8. If the SSG is to be frequency synchronized, then the desired 8 out of 59 set signals for the last block must correspond to one or more of these phases.

In particular, let us assume that one of the 59 output pulses corresponds to the covered Phase 1 and, for bookkeeping purposes, let us also call this the first pulse of a 512 pulse input sequence. In accordance with the earlier description of circuit operation, the next 59 pulse of interest will occur 13 + 8N pulses later and the next sync C pulse will cover input pulses 65 through 72. With $n = 7$, the next covered 59 output corresponds to input pulse 70 (13 + 8.7 = 69 pulses after the first pulse) or our defined Phase 6. We could continue this process to see that $n$ is always 6 or 7 and the effective sync sequence is Phase 1,6,3,8,5,2,7,4 and then starts over with 1 for the next 512 pulse input cycle. Thus, each of the covered phases is used exactly once during a complete cycle. This use of the external sync C signal achieves frequency synchronization, but the output will be stable in any one of eight possible phases.

To absolutely synchronize (i.e., phase as well as frequency synchronize) the output a small amount of additional information is needed. Recall that the effective sync-phase sequence was . . . . ,3,8,5,2,7,4,1,6,3 . . . . If we define Phases 1 through 4 as being covered by a first half (F) sync pulse and Phases 5 through 8 by a second half (S) sync pulse, as shown by the waveforms of FIG. 6 labeled "Sync F" and "Sync S," and the full sync pulse as defined above as C, a useful sync sequence could be

. . . ,F,S,S,F,S,F,F,S, . . . .

In particular, in each 512 pulse cycle F and S are consecutively useful only once. If either of these pairs (S,S, or F,F) is constrained, the remaining 6 sync pulses may be either F or S as required, or even C. Thus, an absolute sync sequence might be . . . ,S,S,C,C,C,C,C,C, . . . as shown in FIG. 6 by the waveform designated "Absolute Sync". The alternative, absolute sync sequence could, of course, just as readily be . . . ,F,F,C,C,C,C,C,C, . . . .

Some comment on the actual transient synchronization process is in order. It was noted that one 59 pulse is produced for each eight of the 512 pulse input, except if and when a sync pulse coincides with a 59 pulse and then the next 59 pulse will occur 13 inputs later. This is an effective movement of either −3 or +5 phases since operation of the SSG in the absence of a sync is modulo 8. A missed (noncoincident) sync pulse thus causes a relative movement of the 59 pulse pattern and the sync pattern of either +3 or −5 pulse positions. For the absolute sync pattern above, the opportunity to "miss" occurs twice each cycle (at the time of the narrow sync S signals) and in the worst case 7 misses are required for sync. Even in this case, however, it can be shown that complete synchronization occurs in less than four 512 pulse cycles (125 usec). The average sync time from a random start is less than 50 microseconds or about one and one-half cycles. The sync pattern above ( . . . S,S,C,C,C,C,C,C, . . . ) is the simplest (in hardware) to achieve and provides reasonably rapid sync from power turn-on. There are obviously (more complicated) sync patterns which will have faster sync times (e.g., . . . F,S,S,F,S,F,F,S, . . . ) but these require more hardware.

"Synchronization" of the SSG has been used in two distinctly different ways. The first refers to constraining the SSG to produce at the correct frequency, and the second refers to constraining the phase of the SSG output to an arbitrary reference. This second constraint is a requirement of the system that incorporates the SSG and may not be applicable to other and different systems.

The described circuit produces the unique smooth sequence and for the 193 output pulses of one cycle the individual pulse position error is (not consecutively)

$$0 \pm nt/193; \text{ where } n = 0,1,2, \ldots ,96,$$

and $t$ is the period of the reference source (61 ns).

Figure 7:
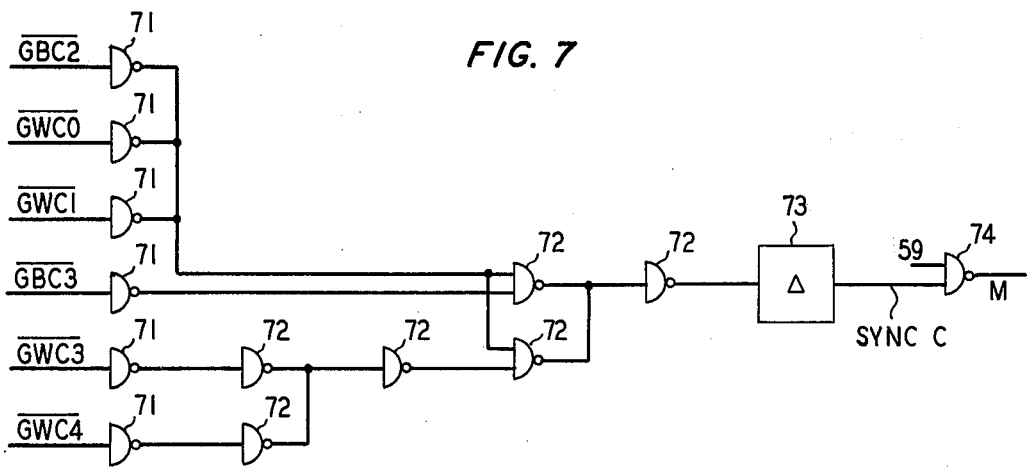
FIG. 7 is a schematic diagram of the sync circuit shown in FIGS. 4 and 5.

The reference source 51 of FIG. 5 produces the 16.384 Mbs signal illustrated in FIG. 1 of the drawings and the divider 52 derives the GBC and GWC waveforms also shown in FIG. 1. As noted hereinbefore, these divider operations are quite straightforward and well within the skill of those in the art. Selected ones of the latter waveforms are delivered to the sync circuit 41, shown in detail in FIG. 7 of the drawings. In FIG. 7, it is really the inverse (e.g., $\overline{GBC2}$, $\overline{GWC0}$, . . . ) of the particular GBC and GWC waveforms that are delivered to the sync circuit NAND gates 71; an inverse waveform is readily derived using a single input NAND gate. These input waveforms are combined by the NAND gate 72 circuitry, in the illustrated manner, to obtain the requisite sync C signal. The delay circuit 73 can comprise a series of single-input NAND gates (e.g., 3 or 4) connected in tandem; the delay serves to offset the delay encountered in the tandem coupled routing circuits and to insure that 8 of each 64 of the original 512 pulse train are "covered" in the manner illustrated by the first two waveforms of FIG. 6. The sync C signal is NANDed with the 59 pulse output of the last stage 5 of the SSG and the output of NAND gate 74 is connected to the set or control terminal of this last stage. The circuit of FIG. 7 relates specifically to the described embodiment of the invention and it will be evident that for another and different prime fraction, for example, the configuration of the NAND gates would be different from that shown in FIG. 7. Here again, however, the manner in which the NAND gates would be interconnected to derive the desired sync signal is well within the skill of one in the art.

The 193 smooth pulse sequence can be delivered to a filter 55 to extract a strong 6.176 MHz component. To this end, a two-pole monolithic crystal filter (MCF) can be used, with a 6 kHz 3 dB passband centered at 6.176 MHz. A signal-shaping network 56 at the filter output can then be used to produce a 6.176 Mbs regular pulse train with 50 percent duty cycle.

The SSG of the invention is advantageously suited to those prime fractions wherein the denominator is a binarily related number (e.g., 32,64,128,256,512, . . . ). The derivation of the appropriate external synchronizing signal is much simplified in this case. However, the principles of the invention are not so limited and a SSG can be constructed in accordance with the present invention so as to divide a uniform pulse sequence by virtually any predetermined, proper rational fraction.

A number of rational fractions have been considered (e.g., 11/24,19/24,49/128,67/128,101/400,113/500, . . . ) and a SSG capable of dividing a uniform pulse sequence in accordance with the same can be readily designed. While all of the multitude of possible rational fractions have not been investigated, there would seem to be no apparent reason why the principles of the invention cannot be utilized to divide a given uniform pulse sequence by virtually any predetermined prime fraction.

Accordingly, although a specific embodiment of the invention has been described in detail, it is to be understood that numerous other embodiments may be devised by those skilled in the art without departing from the spirit and scope of the invention.

What is claimed is:

1. A smooth sequence generator capable of dividing a uniform pulse sequence from a reference source which is delivered to its input in accordance with a predetermined rational fraction comprising a plurality of routing circuit means coupled in tandem, each routing means having an input, a first and a second output and a control terminal that serves to route a pulse presented to the input of the routing means to said first or second output, the first output of each routing means connected to the next tandem-coupled routing means, a feedback connection from the first output of each routing means to the control terminal of the preceding routing means to control the routing of a pulse presented to the input of the latter, and synchronization means coupled to the source of the uniform pulse sequence and the first output of the last tandem-coupled routing means, said synchronization means providing an output signal to the control terminal of said last routing means to constrain the frequency or phase of the smooth sequence generator output to a synchronization signal derived from the uniform pulse sequence.

2. A smooth sequence generator as defined in claim 1 wherein said synchronization means includes means for deriving a synchronization signal which covers a predetermined number of pulses at predetermined spaced intervals.

3. A smooth sequence generator as defined in claim 2 wherein the generated smooth pulse sequence has an individual pulse position error of
$0 \pm nt/193$, where $n = 0,1,2, \ldots 96$, and $t$ is the period of the uniform pulse sequence.

4. A smooth sequence generator as defined in claim 3 wherein the uniform pulse sequence is divided in accordance with the rational fraction 193/512.

5. A smooth sequence generator as defined in claim 1 wherein the smooth sequence output thereof is delivered to filtering and signal-shaping means for deriving a regular pulse train therefrom at the same baseband rate.

6. A smooth sequence generator comprising a plurality of routing circuit means coupled in tandem, a reference source of uniformly spaced pulses coupled to the first of the tandem-coupled routing means, each routing means having an input, a first and second output and a control terminal that serves to route a pulse presented to the input of the routing means to said first or second output, the first output of each routing means connected to the next tandem-coupled routing means, a feedback connection from the first output of each routing means to the control terminal of the preceding routing means to control the routing of a pulse presented to the input of the latter, means coupled to the reference source for deriving a synchronization signal which covers a predetermined number of uniformly spaced pulses at predetermined spaced intervals, and means coupled to the last-recited means and the first output of the last tandem-coupled routing means and serving to deliver an output signal to the control terminal of said last routing means to constrain the frequency or phase of the smooth sequence generator output to said synchronization signal.

* * * * *

UNITED STATES PATENT AND TRADEMARK OFFICE
CERTIFICATE OF CORRECTION

PATENT NO. : 4,034,302

DATED : July 5, 1977

INVENTOR(S) : Carl J. May, Jr.

It is certified that error appears in the above-identified patent and that said Letters Patent are hereby corrected as shown below:

In the Abstract, line 21, after "SSG" insert --output to the reference--. Column 2, line 64, "GBS" should read --GBC'S--. Column 3, line 8, "systems" should read --system--. Column 3, line 62, "smoot" should read --smooth--. Column 4, line 14, after "59" add --set--. Column 7, line 35, of Claim 2, after "number of" add --uniform--.

Signed and Sealed this

Nineteenth Day of September 1978

[SEAL]

Attest:

RUTH C. MASON
*Attesting Officer*

DONALD W. BANNER
*Commissioner of Patents and Trademarks*